United States Patent
Hatakeyama

(10) Patent No.: US 7,044,755 B2
(45) Date of Patent: May 16, 2006

(54) GROUND TERMINAL AND METHOD FOR MOUNTING A PRINTED BOARD MOUNTED WITH A GROUND TERMINAL TO A CHASSIS

(75) Inventor: Toshihiro Hatakeyama, Kawagoe (JP)

(73) Assignee: Kyoshin Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/805,234

(22) Filed: Mar. 22, 2004

(65) Prior Publication Data

US 2004/0209498 A1    Oct. 21, 2004

(30) Foreign Application Priority Data

Apr. 18, 2003 (JP) ............... 2003-114555

(51) Int. Cl.
*H01R 13/648* (2006.01)
(52) U.S. Cl. ......................... 439/97; 439/927
(58) Field of Classification Search ............... 439/97, 439/101, 441, 461, 860, 927
See application file for complete search history.

(56) References Cited

U.S. PATENT DOCUMENTS

| | | | | |
|---|---|---|---|---|
| 3,670,292 A | * | 6/1972 | Tracy | 439/608 |
| 3,670,409 A | * | 6/1972 | Reimer | 29/853 |
| 4,205,889 A | | 6/1980 | Rieman | |
| 4,468,615 A | * | 8/1984 | Jamet et al. | 324/754 |
| 5,620,290 A | * | 4/1997 | Homfeldt et al. | 411/533 |
| 5,877,673 A | * | 3/1999 | Kotani et al. | 338/162 |

FOREIGN PATENT DOCUMENTS

| | | |
|---|---|---|
| JP | 7 335327 | 12/1995 |
| JP | 10 215047 | 8/1998 |
| JP | 2863981 B2 | 12/1998 |
| JP | 2001-97298 | 4/2001 |

* cited by examiner

*Primary Examiner*—James R. Harvey
(74) *Attorney, Agent, or Firm*—Birch Stewart Kolasch & Birch LLP

(57) ABSTRACT

A ground terminal capable of being downsized and having good electrical connectability with a chassis. The ground terminal includes a ground terminal body formed into an annular shape as viewed in plan, and at least one connection portion formed integrally with the ground terminal body, the connection portion being bendable and extending from an inner circumference of the ground terminal body toward the center of the ground terminal. When a mounting screw used to mount a printed board mounted with the ground terminal to a chassis is inserted into the annular ground terminal body and a mounting hole of the printed board, the connection portion of the ground terminal is bent in the mounting hole to be brought in contact with the chassis.

8 Claims, 5 Drawing Sheets

GROUND TERMINAL AND METHOD FOR MOUNTING A PRINTED BOARD MOUNTED WITH A GROUND TERMINAL TO A CHASSIS

CROSS-REFERENCE TO A RELATED APPLICATION

This nonprovisional application claims priority under 35 U.S.C. §119(a) on Patent Application No. 2003-114555 filed in Japan on Apr. 18, 2003, the entire contents of which are hereby incorporated by reference.

BACKGROUND OF THE INVENTION

1. Field of the Invention

The present invention relates to a ground terminal and a method for mounting a printed board mounted with a ground terminal to a chassis.

2. Description of the Related Art

In electronic equipment, especially in a vehicle-mounted audio equipment, it is essentially required to take a measure to reduce noise. To this end, a ground terminal is mounted on a printed board and electrically connected to a chassis, so that the printed board is grounded to the chassis. Such a ground terminal is disclosed for example in Japanese patent publication no. 2863981. As shown in FIG. 11, this ground terminal 1 comprises a first longitudinal half and a second longitudinal half which is wider in width than the first half. The first half has side edge portions each formed with a plurality of connection portions 1a, and the second half is formed with a mounting hole (screw insertion hole) 1c. The ground terminal 1 is placed on a printed board, with the connection portions (solder portions) 1a and the mounting hole 1c individually aligned with connection portions and a mounting hole formed in the printed board, and is then mounted on the printed board by soldering the connection portions 1a to the connection portions of the printed board. The printed board is fastened to a chassis together with the ground terminal 1 mounted thereon by using a mounting screw inserted to the mounting hole 1c of the ground terminal 1 and the mounting hole of the printed board and threadedly engaged with a tapped hole of the chassis, whereby the printed board is grounded to the chassis through the ground terminal whose annular portion around the mounting hole 1c is electrically connected to the chassis through the mounting screw.

With miniaturization and high performance of equipment, the printed board is becoming increasingly smaller in size and increasingly higher in part mounting density. For this reason, the ground terminal is demanded to be smaller in size and excellent in electrical connectability with the chassis.

However, the above-mentioned prior art ground terminal which is complicated in shape and difficult to be downsized is not suitable for use in a small-sized equipment. Further, this ground terminal electrically connected to the chassis only through the mounting screw poses a problem that a large connection resistance is caused.

SUMMARY OF THE INVENTION

An object of the present invention is to provide a ground terminal which can be downsized and has good electrical connectability with a chassis, and provide a method for mounting a printed board, mounted with such a ground terminal, to a chassis.

According to one aspect of this invention, there is provided a ground terminal which comprises a ground terminal body formed into an annular shape as viewed in plan, and at least one connection portion formed integrally with the ground terminal body. The connection portion is bendable and extends from an inner circumference of the ground terminal body toward a center of the ground terminal.

The ground terminal of this invention having the annular ground terminal body and the connection portion that are formed into one piece is simple in construction, and can be downsized. On an occasion that a printed board mounted with this ground terminal is mounted to a chassis by using, for example, a mounting screw inserted through a mounting hole of the printed board and threadedly engaged with a tapped hole of the chassis, when the mounting screw is caused to be inserted through the annular ground terminal body, the connection portion of the ground terminal is bent in the mounting hole of the printed board toward the chassis, and a tip end of the connection portion is brought in direct contact with the chassis. The ground terminal is electrically connected not only through the mounting screw but also through the connection portion that is in direct contact with the chassis, whereby the connection resistance between the ground terminal and the chassis decreases.

In this invention, the shape of the ground terminal body is not limited. The ground terminal may be formed into a circular annular shape or a polygonal annular shape.

The length of the connection portion of the ground terminal measured from the inner circumference of the ground terminal body to a tip end of the connection portion is preferably larger than a thickness of that portion of a printed board in which a mounting hole used to mount the ground terminal on the printed board is formed. In this case, the tip end of the connection portion bent in the mounting hole of the printed board toward a chassis is brought in contact with the chassis with reliability.

The ground terminal is preferably provided with a plurality of connection portions that are formed integrally with the ground terminal body and spaced from one another in a direction of the inner circumference of the ground terminal body. These connection portions are bendable and extend from the inner circumference of the ground terminal body toward the center of the ground terminal. With this preferred embodiment, the connection portions are bent in the mounting hole of the printed board toward the chassis when the mounting screw is caused to be inserted through the ground terminal body when the printed board mounted with the ground terminal is mounted to the chassis using the mounting screw, and as a result, tip ends of the connection portions are brought in direct contact with the chassis, whereby improved electrical connection is established between the ground terminal and the chassis.

Preferably, the plurality of connection portions of the ground terminal are symmetric with respect to the center of the ground terminal as viewed in plan. In this case, the connection portions are bent uniformly when the mounting screw is caused to be inserted through the ground terminal body, whereby the tip ends of the connection portions are brought in contact with the chassis with reliability.

The ground terminal body may be used to establish electrical connection with a printed board to which the ground terminal is mounted. For instance, the ground terminal body is soldered to a solder portion formed as a connection portion in the printed board. In this case, it is unnecessary to additionally provide the ground terminal with a connection portion such as a solder portion used to establish electrical connection with the printed board, making it possible to simplify the construction of the ground terminal and to downsize the ground terminal.

According to another aspect of this invention, there is provided a method for mounting a printed board mounted with a ground terminal to a chassis, which comprises the steps of: (a) preparing a ground terminal comprising a ground terminal body formed into an annular shape as viewed in plan, and at least one connection portion formed integrally with the ground terminal body, the connection portion being bendable and extending from an inner circumference of the ground terminal body toward a center of the ground terminal; (b) mounting the ground terminal on the printed board with the ground terminal body aligned with a mounting hole of the printed board; and (c) placing the printed board mounted with the ground terminal on the chassis, with the mounting hole of the printed board aligned with a tapped hole of the chassis, and tightening a mounting screw inserted to the ground terminal body and the mounting hole of the printed board and threadedly engaged with the tapped hole of the chassis, thereby mounting the printed board to the chassis and causing the connection portion of the ground terminal to be bent in the mounting hole of the printed board and to be brought in direct contact with the chassis.

According to the mounting method of this invention, the connection portion of the ground terminal is bent in the printed board and is brought in direct contact with the chassis when the mounting screw is tightened in mounting the printed board mounted with the ground terminal onto the chassis, and thus electrical connectability between the ground terminal and the chassis is improved.

BRIEF DESCRIPTION OF THE DRAWINGS

The present invention will become more fully understood from the detailed description given herein below and the accompanying drawings which are given by way of illustration only, and thus, are not limitative of the present invention, and wherein.

DETAILED DESCRIPTION OF THE PREFERRED EMBODIMENTS

In the following, a ground terminal according to a first embodiment and a method for mounting a printed board mounted with the ground terminal to a chassis will be explained.

Figure 2:
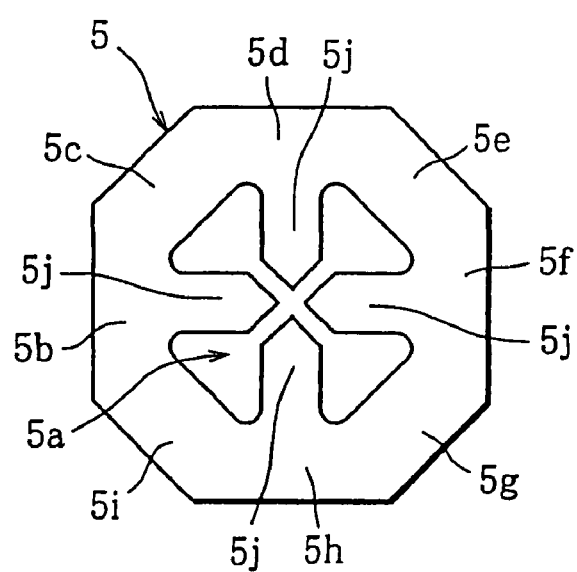
FIG. 2 is a plan view of the ground terminal shown in FIG. 1.

Referring to FIG. 2, the ground terminal 5 of this embodiment, which is fabricated for example by stamping a metal sheet, comprises a ground terminal body 5' having terminal body portions 5b–5i and formed into an annular shape as viewed in plan, and a plurality of, for example, four connection portions (hereinafter referred to as first through fourth connection portions) 5j that are tongue pieces formed integrally with the ground terminal body 5'. A cross recess 5a is defined between the ground terminal body 5' and the first through fourth connection portions 5j. The ground terminal body may be formed into a circular annular shape or a polygonal annular shape as viewed in plan. The ground terminal body 5' of this embodiment is formed into an octagonal annular shape having an octagonal outer circumference and an octagonal inner circumference, and is comprised of first through eighth terminal body portions 5b–5i.

The first through fourth connection portions 5j of the ground terminal 5 are provided so as to be spaced from each other along the inner circumference of the octagonal annular shaped ground terminal body 5', and are disposed to be symmetric with respect to the center of the ground terminal 5 as viewed in plan. The first through fourth connection portions 5j extend from the inner circumference of the first, third, fifth and seventh terminal body portions 5b, 5d, 5f, 5h toward the center of the ground terminal 5, respectively. The connection portions 5j have their triangular tip ends facing one another with a slight spacing. The length of each connection portion 5j measured from the inner circumference of the ground terminal body 5' to the tip end of the connection portion 5j is larger than the thickness of that portion of a printed board 2 in which a mounting hole 2a is formed. The connection portions 5j are bendable at the inner circumference of the terminal body portions 5b, 5d, 5f and 5h.

Figure 1:
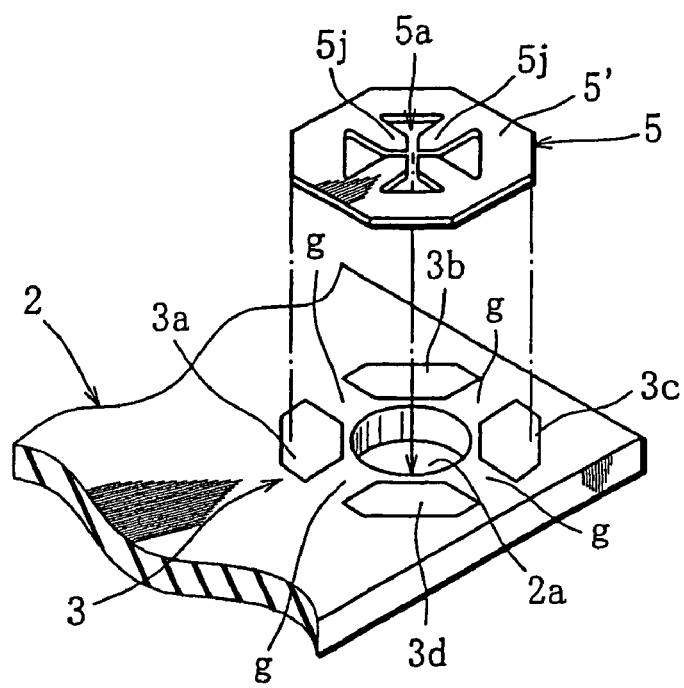
FIG. 1 is a perspective view showing a ground terminal according to a first embodiment of this invention, together with a printed board on which the ground terminal is to be mounted.
Figure 3:
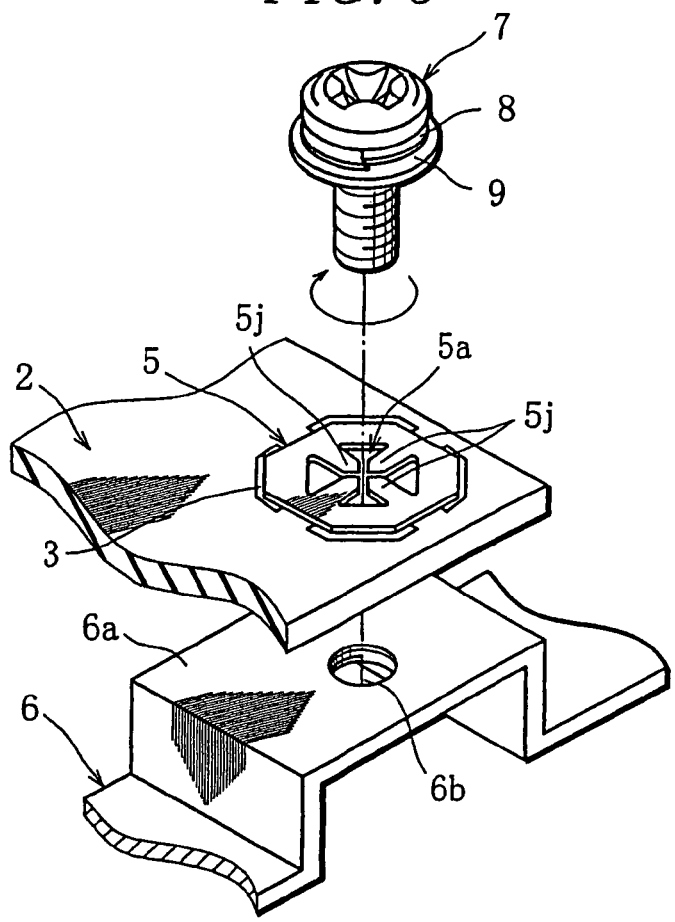
FIG. 3 is a perspective view showing the printed board mounted with the ground terminal shown in FIG. 1, together with a chassis to which the printed board is to be mounted.

As shown in FIGS. 1 and 3, the ground terminal 5 is mounted to the printed board 2 and is then mounted to a chassis 6 together with the printed board 2 by using a mounting screw 7.

As shown in FIG. 1, the printed board 2 is formed at for example its corner portion with a mounting hole 2a around which a connection portion 3 is formed. The connection portions 5j of the ground terminal 5 are connected to the connection portion 3 of the printed board. The connection portion 3 includes a plurality of solder portions, for example, first through fourth solder portions 3a–3d, which are disposed around and coaxially with the mounting hole 2a so as to be spaced from one another with a spacing g. The terminal body portions 5c, 5e, 5g and 5i of the ground terminal 5 are soldered to the solder portions 3a–3d of the printed board 2, respectively.

Referring to FIG. 3, reference numeral 6 denotes a chassis having a printed-board mounting portion 6a to which the printed board 2 mounted with the ground terminal 5 is mounted. The chassis 6 is made of an electrically conductive metal member. The printed-board mounting portion 6a of the chassis 6 is formed with a tapped hole 6b with which a mounting screw 7 is threadedly engaged. The mounting screw 7 may be of a washer built-in type having a spring washer 8 and a plain washer 9.

In the following, a method for mounting the printed board 2 mounted with the ground terminal 5 to the chassis 6 will be explained.

First, the ground terminal 5, the printed board 2, and the chassis 6 having the aforementioned construction are prepared. Next, the printed board 2 is positioned at a predetermined position with respect to a mounter, not shown. Then, the ground terminal 5 is picked up by suction at its central portion, i.e., tip end portions of the first through fourth connection portions 5j of the ground terminal 5, by means of a suction nozzle of the mounter. Since the ground terminal is light in weight and the spacing between the tip ends of the connection portions 5j is narrow, the ground terminal 5 can be reliably held by means of the suction nozzle.

Next, the ground terminal 5 is placed on the printed board 2 by using the mounter so that the center of the ground terminal 5 is in alignment with the center of the mounting hold 2a of the printed board 2 and the terminal body portions 5c, 5e, 5g and 5i of the ground terminal 5 are in alignment with the solder portions 3a–3d of the printed board 2, respectively. Subsequently, the terminal body portions 5c, 5e, 5g and 5i of the ground terminal 5 are soldered to the solder portions 3a–3d of the printed board 2.

The surface tension of molten solder uniformly acts on the terminal body portions 5c, 5e, 5g and 5i of the ground terminal 5, whereby the ground terminal 5 is automatically positioned with accuracy around the mounting hole 2a of the printed board 2 since the terminal body portions 5b–5j are coaxial with the center of the ground terminal 5, the solder portions 3a–3d are coaxial with the mounting hole 2a of the printed board 2, the four terminal body portions 5c, 5e, 5g and 5i of the ground terminal 5 are individually aligned with the solder portions 3a–3d of the printed board 2, and the solder portions 3a–3d are spaced with a spacing g. Thus, the ground terminal 5 is accurately surface mounted on the printed board 2 around the mounting hole 2a.

Next, the printed board 2 mounted with the ground terminal 5 is attached to the chassis 6. To this end, the printed board is first placed on the chassis 6, with the mounting hole 2a of the printed board 2 aligned with the tapped hole 6a of the chassis 6. As a result, the mounting hole 2a of the printed board 2, the terminal body 5' of the ground terminal 5, and the tapped hole 6a of the chassis 6 are in alignment with one another.

Figure 4A:
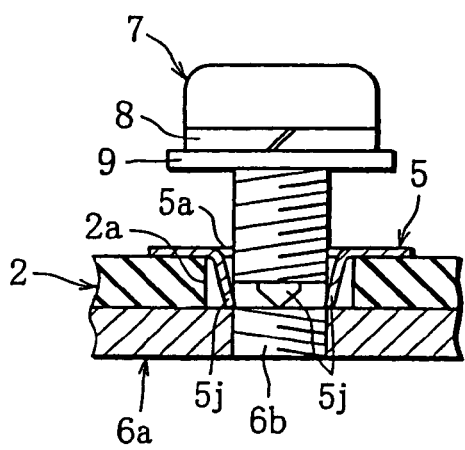
FIG. 4A is a section view showing the printed board shown in FIG. 3 in a state where a mounting screw is inserted into an annular ground terminal body of the ground terminal and a mounting hole of the printed board.

Subsequently, when the mounting screw 7 is caused to be inserted from above into the octagonal annular shaped ground terminal body 5', the first through fourth connection portions 5j of the ground terminal 5 are bent along the inner circumference of the ground terminal body 5'. When the mounting screw 7 is further inserted, the connection portions 5j are caused to be pressed into the mounting hole 2a of the printed board 2, as shown in FIG. 4A. The mounting screw 7 inserted into the annular ground terminal body 5' and the mounting hole 2a of the printed board 2 is brought in threaded engagement with the tapped hole 6a of the chassis 6. At this time, the connection portions 5j of the ground terminal 5 are bent substantially at right angles within the mounting hole 2a of the printed board 2, and tip ends of the connection portions are brought in direct contact with the chassis 6. Meanwhile, the mounting hole 2a of the printed board 2 has a diameter which is larger than the sum of the diameter of the mounting screw 7 and a value which is two times as large as the thickness of the ground terminal 5.

Figure 4B:
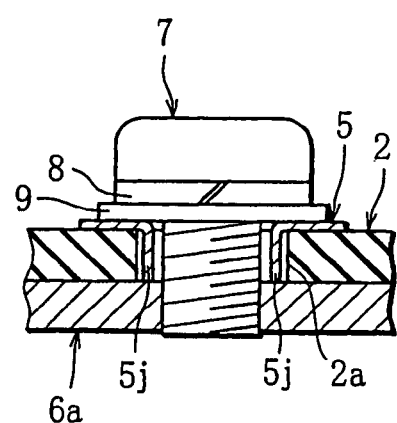
FIG. 4B is a section view showing the printed board mounted to the chassis by tightening the mounting screw.

When the mounting screw 7 is tightened, the printed board 2 on which the ground terminal 5 is mounted is fastened to the mounting portion 6a of the chassis 6, as shown in FIG. 4B. At this time, the tip ends of the connection portions 5j of the ground terminal 5 are in contact with an upper face of an annular portion of the chassis 6 around the tapped hole 6b. In other words, the connection portions 5j of the ground terminal 5 are in direct contact with the chassis 6, whereby the ground terminal 5 is connected to the chassis 6 with a small connection resistance and hence good electrical conduction is achieved therebetween. In addition, an upper face of the ground terminal body 5' is in urged contact with a lower face of the head of the mounting screw 7 through the plain washer 9 and the spring washer 8, and accordingly, the ground terminal 5 is electrically connected to the chassis 6 through the mounting screw 7.

FIGS. 5–10 show ground terminals according to second through seventh embodiments of this invention. In these embodiments, elements corresponding to those of the ground terminal 5 of the first embodiment shown in FIG. 2 are denoted by corresponding reference numerals, and explanations thereof will be omitted.

Figure 5:
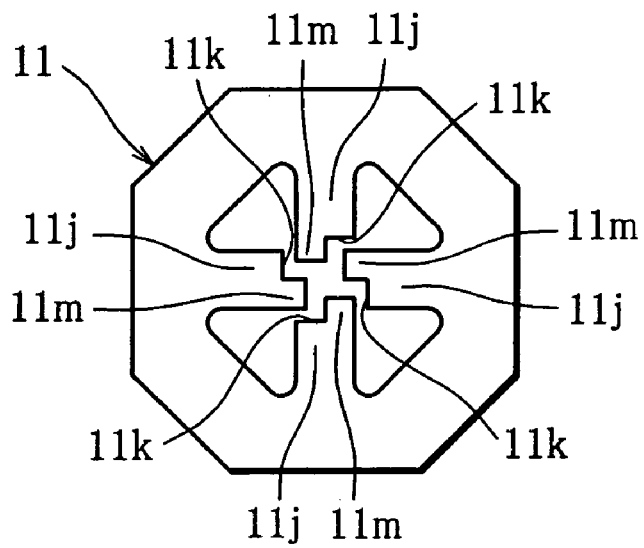
FIG. 5 is a plan view showing a ground terminal according to a second embodiment of this invention.

The ground terminal 11 of the second embodiment shown in FIG. 5 comprises first through fourth connection portions 11j extending from an annular ground terminal body, having an octagonal outer circumference and an octagonal inner circumference, toward the center of the ground terminal 11. Each of the connection portions 11j has a first and a second widthwise half. The first half of each connection portion 11j is formed at it tip end with a notch 11k. The tip end 11m of the second half of each connection portion 11j enters the notch 11k of the adjacent connection portion 11j. When the connection portions 11j are bent along the inner circumference of the annular ground terminal body upon insertion of a mounting screw to connect a printed board mounted with the ground terminal 11 to a chassis, the tip ends 11m of the connection portions 11j are brought in direct contact with the chassis.

As understood from the foregoing explanation, the ground terminal 11 is characterized in that the connection portions 11j are made as long as possible while preventing interference between adjacent connection portions. Hence, the ground terminal 11 can be made compact in size.

Figure 6:
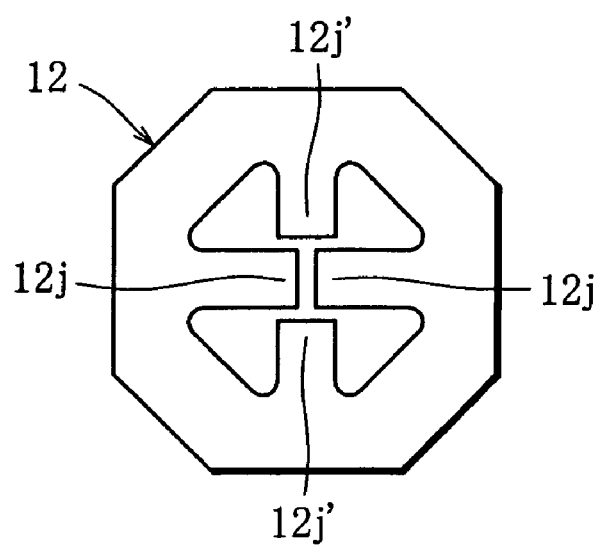
FIG. 6 is a plan view of a ground terminal according to a third embodiment of this invention.

The ground terminal 12 of the third embodiment shown in FIG. 6 includes first through fourth connection portions 11j extending from an annular ground terminal body, having an octagonal outer circumference and an octagonal inner circumference, toward the center of the ground terminal 12. The second and fourth connection portions 12j' have their length which is shorter than the length of the first and third connection portions 12j, so that tip ends of the first and third connection portions 12j may enter between tip ends of the second and fourth connection portions 12j'. When the first though fourth connection portions 11j are bent along the inner circumference of the annular ground terminal body, the tip ends of the first and third connection portions are brought in direct contact with the chassis.

The ground terminal 12 is characterized in that the two connection portions 12j are made as long as possible while preventing interference between the connection portions 12j, 12j'. Thus, the ground terminal 12 can be downsized. More generally, among a plurality of connection portions, those connection portions other than a pair of opposed connection portions may have their length shorter than the length of the paired connection portions, so that tip ends of the long connection portions may enter between the short connection portions.

Figure 7:
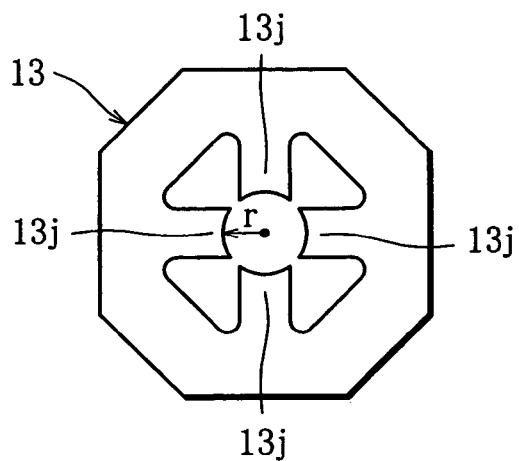
FIG. 7 is a plan view of a ground terminal according to a fourth embodiment of this invention.

The ground terminal 13 of the fourth embodiment shown in FIG. 7 includes first through fourth connection portions 13j extending, toward the center of the ground terminal 13, from an annular ground terminal body having an octagonal outer circumference and an octagonal inner circumference. The tip end of each connection portion 13j is formed into an arcuate shape extending along the circumference of a circle centered at the center of the ground terminal 13 and having a radius of r. When the first through fourth connection portions 13j are bent along the inner circumference of the ground terminal body, the tip end of each of the connection portions 13j is in contact with the chassis. The ground terminal 13 is characterized in that the tip end of each connection portion is formed into an arcuate shape to ensure that each connection portion is in contact with the chassis.

Figure 8:
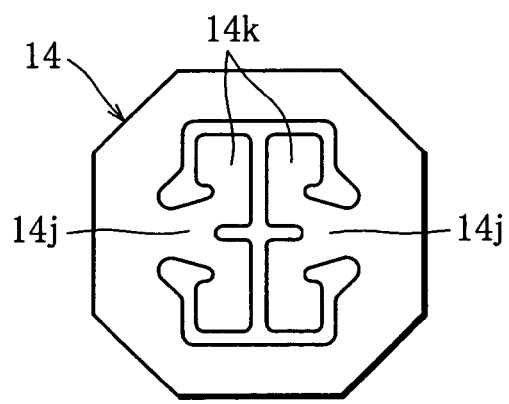
FIG. 8 is a plan view of a ground terminal according to a fifth embodiment of this invention.

The ground terminal 14 of the fifth embodiment shown in FIG. 8 includes first and second connection portions 14j extending from an annular ground terminal body, having an octagonal outer circumference and a square inner circumference, toward the center of the ground terminal 14. Each connection portions 14j has a wide tip end portion 14k facing that 14k of another connection portion 14j, so as to increase a contact area between the tip end of the connection portion 14j and the chassis.

Figure 9:
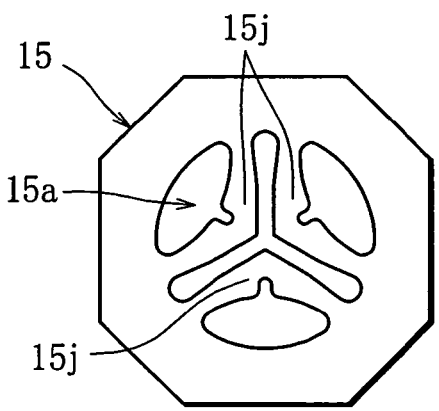
FIG. 9 is a plan view of a ground terminal according to a sixth embodiment of this invention.

The ground terminal 15 of the sixth embodiment shown in FIG. 9 includes three connection portions 15j of a triangular shape extending from an annular ground terminal body, having an octagonal outer circumference and a circular inner circumference, toward the center of the ground terminal 15. An elliptical hole 15a is formed in a proximal portion of each connection portion 15j, so that the connection portion 15j may easily be bent. When the connection portions 15j are bent, their tip ends are in contact with the chassis.

Figure 10:
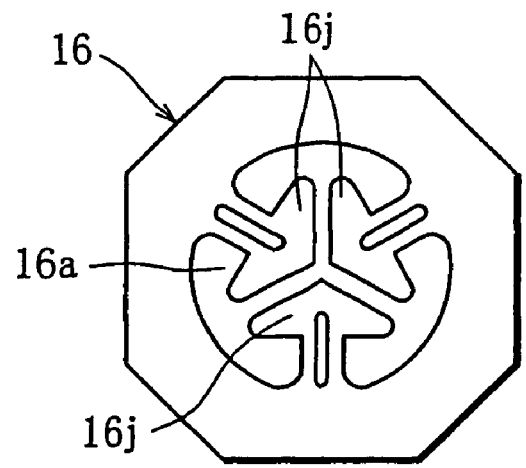
FIG. 10 is a plan view of a ground terminal according to a seventh embodiment of this invention.
Figure 11:
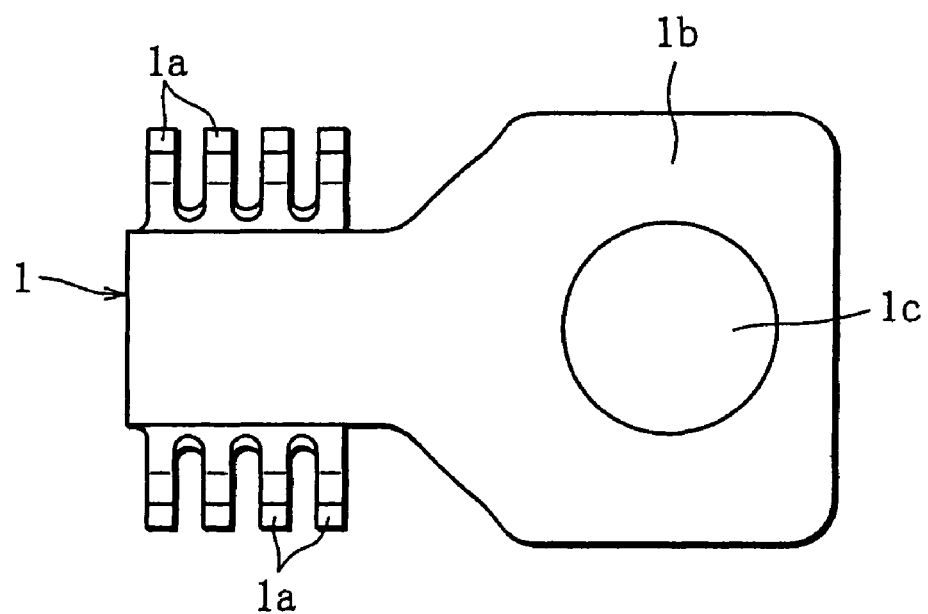
FIG. 11 is a plan view showing a conventional ground terminal.

The ground terminal 16 of the seventh embodiment shown in FIG. 10 includes three connection portions 16j of a arrowhead shape extending from an annular ground terminal body, having an octagonal outer circumference and a circular inner circumference, toward the center of the ground terminal 16. The arrowhead-shaped connection portion 16j can easily be bent since it has a narrow width at its proximal portion and an elongated hole is formed along the longitudinal axis of the connection portion 16j. When the connection portions 16j are bent, their tip ends are in contact with the chassis.

The present invention is not limited to the foregoing first through seventh embodiments, and may be modified variously.

For instance, each of the ground terminals of the embodiments comprises a polygonal annular ground terminal body having an octagonal outer circumference and an octagonal, square or circular inner circumference. However, in this invention, the outer and inner circumferences of the ground terminal body are not limited to those. For instance, the ground terminal body may be formed into a hexagonal annular shape or a circular annular shape.

What is claimed is:

1. A ground terminal comprising:
a ground terminal body formed into an annular shape as viewed in plan; and
at least one connection portion formed integrally with the ground terminal body, said connection portion being bendable and extending from an inner circumference of the ground terminal body toward a center of the ground terminal,
said ground terminal comprises a plurality of connection portions that are formed integrally with the ground terminal body and spaced from one another in a direction of the inner circumference of the ground terminal body, these connection portions being bendable and extending from the inner circumference of the ground terminal body toward the center of the ground terminal,
wherein each of the plurality of connection portions has a first and a second widthwise half, and the first widthwise half of each connection portion is formed at it tip end with a notch to which a tip end of the second widthwise half of an adjacent connection portion enters.

2. A ground terminal comprising:
a ground terminal body formed into an annular shape as viewed in plan; and
at least one connection portion formed integrally with the ground terminal body, said connection portion being bendable and extending from an inner circumference of the ground terminal body toward a center of the ground terminal,
wherein said ground terminal comprises a plurality of connection portions that are formed integrally with the ground terminal body and spaced from one another in a direction of the inner circumference of the ground terminal body, these connection portions being bendable and extending from the inner circumference of the ground terminal body toward the center of the ground terminal,
wherein among the plurality of connection portions, those connection portions other than a pair of opposed connection portions have their length shorter than a length of the paired connection portions, so that tip ends of the long connection portions enter between the short connection portions.

3. The ground terminal according to claim 2, wherein each of the plurality of connection portions of the ground terminal has a tip end thereof formed into an arcuate shape.

4. The ground terminal according to claim 2, wherein the plurality of connection portions are comprised of two connection portions each having a wide tip end portion facing that of another connection portion.

5. A ground terminal comprising:
a ground terminal body formed into an annular shape as viewed in plan; and
at least one connection portion formed integrally with the ground terminal body, said connection portion being bendable and extending from an inner circumference of the ground terminal body toward a center of the ground terminal,
wherein said ground terminal comprises a plurality of connection portions that are formed integrally with the ground terminal body and spaced from one another in a direction of the inner circumference of the ground terminal body, these connection portions being bendable and extending from the inner circumference of the ground terminal body toward the center of the ground terminal,
wherein each of the plurality of connection portions is formed at its proximal portion with a hole.

6. The ground terminal according to claim 5, wherein each of the plurality of connection portions is formed into an arrowhead shape whose proximal portion is narrow in width.

7. A ground terminal comprising:
a ground terminal body formed into an annular shape as viewed in plan; and
at least one connection portion formed integrally with the ground terminal body, said connection portion being bendable and extending from an inner circumference of the ground terminal body toward a center of the ground terminal, said ground terminal comprises a plurality of connection portions that are formed integrally with the ground terminal body and spaced from one another in a direction of the inner circumference of the ground terminal body, these connection portions being bendable and extending from the inner circumference of the ground terminal body toward the center of the ground terminal, each of the plurality of connection portions is formed into an arrowhead shape whose proximal portion is narrow in width, wherein each of the plurality of connection portions is formed with an elongated hole extending along a longitudinal axis of the connection portion.

8. A method for mounting a printed board mounted with a ground terminal to a chassis, comprising the steps of:

(a) preparing a ground terminal comprising a ground terminal body formed into an annular shape as viewed in plan, and at least one connection portion formed integrally with the ground terminal body, the connection portion being bendable and extending from an inner circumference of the ground terminal body toward a center of the ground terminal;

(b) mounting the ground terminal on the printed board with the ground terminal body aligned with a mounting hole of the printed board; and (c) placing the printed board mounted with the ground terminal on the chassis, with the mounting hole of the printed board aligned with a tapped hole of the chassis, and tightening a mounting screw inserted to the ground terminal body and the mounting hole of the printed board and threadedly engaged with the tapped hole of the chassis, thereby mounting the printed board to the chassis and causing the connection portion of the ground terminal to be bent in the mounting hole of the printed board and to be brought in direct contact with the chassis.

* * * * *